United States Patent [19]

Ashok et al.

[11] Patent Number: 4,822,693

[45] Date of Patent: Apr. 18, 1989

[54] COPPER-IRON-NICKEL COMPOSITE MATERIAL FOR ELECTRICAL AND ELECTRONIC APPLICATIONS

[75] Inventors: Sankaranarayanan Ashok, Bethany; Jacob Crane, Woodbridge; Julius C. Fister, Hamden, all of Conn.

[73] Assignee: Olin Corporation, New Haven, Conn.

[21] Appl. No.: 28,846

[22] Filed: Mar. 23, 1987

[51] Int. Cl.⁴ .............................................. B32B 15/02
[52] U.S. Cl. ...................................... 428/614; 420/92; 420/458; 420/487; 420/582
[58] Field of Search .................... 420/89, 92, 94, 458, 420/487, 582; 428/614, 629, 929

[56] References Cited

U.S. PATENT DOCUMENTS

| | | | |
|---|---|---|---|
| 1,016,549 | 2/1912 | Clamer | 420/92 |
| 1,455,589 | 5/1923 | Kirk et al. | 420/487 |
| 1,491,913 | 4/1924 | Kirk et al. | 420/487 |
| 1,811,032 | 6/1931 | Smith et al. | 420/487 |
| 2,074,604 | 3/1937 | Bolton et al. | 420/487 |
| 2,196,824 | 4/1940 | Dahl et al. | 420/487 |
| 2,347,543 | 4/1944 | Dannohl et al. | 420/487 |
| 4,457,355 | 7/1984 | Winter et al. | 164/468 |
| 4,465,118 | 8/1984 | Dantzig et al. | 164/452 |
| 4,482,012 | 11/1984 | Young et al. | 165/146 |
| 4,569,692 | 2/1986 | Butt | 75/235 |
| 4,642,146 | 2/1987 | Ashok et al. | 420/479 |
| 4,661,178 | 4/1987 | Ashok et al. | 420/487 |
| 4,711,661 | 12/1987 | Kemp, Jr. et al. | 75/0.5 B |

FOREIGN PATENT DOCUMENTS

| | | | |
|---|---|---|---|
| 13543 | 5/1929 | Australia | 420/92 |
| 3018117 | 11/1980 | Fed. Rep. of Germany | 420/92 |
| 158842 | 12/1981 | Japan | 420/92 |
| 58-119445 | 7/1983 | Japan . | |

OTHER PUBLICATIONS

CUNIFE-I, Alloy Digest, published by Engineering Alloys Digest, Inc., Aug. 1961.

Primary Examiner—L. Dewayne Rutledge
Assistant Examiner—George Wyszomierski
Attorney, Agent, or Firm—H. Samuel Kieser; Paul Weinstein

[57] ABSTRACT

The present invention relates to copper-iron-nickel composite materials having utility in electronic applications because of their low coefficients of expansion and high thermal conductivities. Composite materials in accordance with the present invention consist essentially of about 10% to 80% copper and the balance iron plus nickel with the ratio of iron to nickel being in the range of from about 1.5:1 to about 2.0:1. Preferred composite materials have an iron to nickel ratio in the range of from about 1.6:1 to about 1.9:1.

8 Claims, 2 Drawing Sheets

COPPER-IRON-NICKEL COMPOSITE MATERIAL FOR ELECTRICAL AND ELECTRONIC APPLICATIONS

The invention relates to copper-iron-nickel alloys for use in the electronics industry.

Copper-iron-nickel alloys have been used in a wide variety of applications because of their many desirable properties. For example, these alloys have found utility in tubing because of their high tensile strength, high ductility, and good corrosion resistance. U.S. Pat. No. 1,455,589 to Kirk et al. discloses an alloy consisting of copper, from 3% to 20% iron, and a small quantity of nickel in the proportion of 1 part nickel to 4 to 12 parts iron. This alloy is described as exhibiting a tensile strength of from 59 to 61 ksi. and good non-corrosive qualities. U.S. Pat. No. 1,491,913, also to Kirk et al., describes an alloy containing copper, nickel and iron in approximately the proportion of 20% nickel, 10% iron and the balance copper. This alloy is intended for use as tubing because of its high tensile strength and high ductility.

It has also been suggested that pressure containing parts in valves and fittings to be used at elevated temperatures could be fabricated from copper-iron-nickel alloys. Here again, the strength, ductility and toughness properties of these alloys render them well suited for such applications. U.S. Pat. No. 2,074,604 to Bolton et al. illustrates an alloy intended for this type of application. The Bolton et al. alloy has a copper content of 80% or above, a nickel content of from 6% to 15%, and iron or manganese or both. The iron and/or manganese addition is made to improve the alloy's strength, ductility, and toughness properties and to provide a dendritic structure that is stable at elevated temperatures.

Copper-iron-nickel alloys have also been used in the production of permanent magnets. This is because certain copper-iron-nickel alloys demonstrate particularly desirable magnetic properties such as high coercivity, high initial permeability and good residual magnetism. U.S. Pat. No. 2,196,824 to Dahl et al. describes a copper-iron-nickel alloy having utility as a permanent magnet alloy because of its ability to be precipitation hardened. The Dahl et al. alloy consists of 5% to 55% iron, 15% to 50% nickel and 30% to 75% copper. U.S. Pat. No. 1,811,032 to Smith et al. describes an iron-nickel permanent magnet alloy containing 10% or less copper. U.S. Pat. No. 2,347,543 to Dannohl et al. illustrates a number of copper-iron-nickel alloys intended for use in permanent magnet applications. A commercially available permanent magnet alloy CUNIFE-I having a nominal composition of 60% copper, 20% nickel, and 20% iron is described in *Alloy Digest*, published by Engineering Alloys Digest, Inc., August 1961.

Controlled expansion materials with moderate conductivity are used extensively in the electronics industry. A typical application for such materials would be in printed circuit boards for leadless chip carriers. In this type of application, the thermal expansion properties of the printed circuit board material must be similar to those of the chip package material, e.g. alumina. At present, three materials are being considered for this type of application. These materials are ceramics, Kevlar reinforced epoxy, and copper clad Invar. While ceramics are very desirable from the standpoint of having a low thermal coefficent of expansion, they are very brittle and very expensive. In addition, there are severe size limitations which render them unsuitable for some applications. Kevlar reinforced epoxy is also expensive and suffers from disadvantages such as a susceptibility to microcracking, poor machinability, and a propensity for absorbing water. Copper clad Invar is currently the most favored material for printed circuit board applications. Unfortunately, this composite suffers from poor Z-axis conductivity and high expansion in the Z-direction which renders it unsuitable for applications which require either of these properties. This composite also suffers from being susceptible to a rather strong galvanic corrosion effect on any cut edges where the Invar is exposed.

Recently, it has been discovered that copper-iron-nickel alloys can be tailored to provide desirably low thermal coefficients of expansion on the order of from about 4 ppm/°C. to about 12 ppm/°C. as well as a relatively high thermal conductivity on the order of about 0.6 cal/cm$^2$/cm/sec/°C. or greater. In addition, these alloys can be tailored to have an electrical conductivity in the range of from about 3% IACS to about 60% IACS. These alloys are quite useful for a number of electronics applications because of this unusual combination of properties.

Alloys in accordance with the present invention are those consisting essentially of from about 10% to about 80% copper and the balance iron and nickel with the ratio of iron to nickel in the alloy being in the range of from about 1.5:1 to about 2.0:1. It has been found that the ratio of iron to nickel in the alloy primarily determines its thermal expansion properties. By maintaining the iron to nickel ratio within the aforementioned range, it is possible to provide alloys having very low thermal coefficients of expansion within the aforementioned range. Alloys which are particularly useful in electronics applications are those having an iron to nickel ratio in the range of from about 1.6:1 to about 1.9:1.

The alloys of the present invention may be used in a number of electronics applications. For example, they may be used in semiconductor applications which require a low expansion buffer material between a semiconductor chip and a surrounding metal package. The alloys may also be used as a substrate for supporting large silicon or gallium arsenide chips. Still further, the alloys may be used as a printed circuit board material for leadless chip carriers.

Accordingly, it is an object of the present invention to provide a family of copper-iron-nickel alloys having utility in a number of electronics applications.

It is a further object of the present invention to provide copper-iron-nickel alloys as above having desirably low thermal coefficients of expansion and high thermal conductivity properties.

It is yet a further object of the present invention to provide copper-iron-nickel alloys as above having desirable levels of electrical conductivity.

These and other objects and advantages will become more apparent from the following description and drawings.

As previously discussed, many applications in the electronics industry require the use of a material having low expansion and high thermal conductivity. The alloys of the present invention posess such properties and are particularly well suited for these applications. In addition, the alloys of the present invention can be tailored to provide a variety of combinations of these properties as well as desired levels of electrical conductivity.

The alloys of the present invention comprise copper alloys consisting essentially of from about 10% to about 80% copper and the balance iron and nickel with the ratio of iron to nickel in the alloy being in the range of from about 1.5:1 to about 2.0:1. Preferred alloys have an iron to nickel ratio in the range of from about 1.6:1 to about 1.9:1. Of course, the specific composition of an alloy in accordance with the present invention depends upon the particular application for the alloy. A number of illustrative applications and compositions will be presented hereinafter.

It has been found that the ratio of iron to nickel in the alloy is critical since it is the primary factor which determines the thermal coeffecient of expansion (TCE) properties of the alloy. It is the volume fraction and the composition of the iron-nickel phase that determines the thermal coefficient of expansion of the alloy. Thus, for a given copper content, the thermal coefficient of expansion of the alloy will increase as the iron to nickel ratio decreases. Alloys having iron to nickel ratios within the broad 1.5:1 to 2.0:1 range tend to exhibit thermal coefficients of expansion in the range of from about 4 ppm/°C. to about 12 ppm/°C. In addition, these alloys exhibit a thermal conductivity of at least about 0.6 cal/cm$^2$/cm/sec/°C. and can be provided with an electrical conductivity in the range of from about 3% IACS to about 60% IACS.

Figure 1:
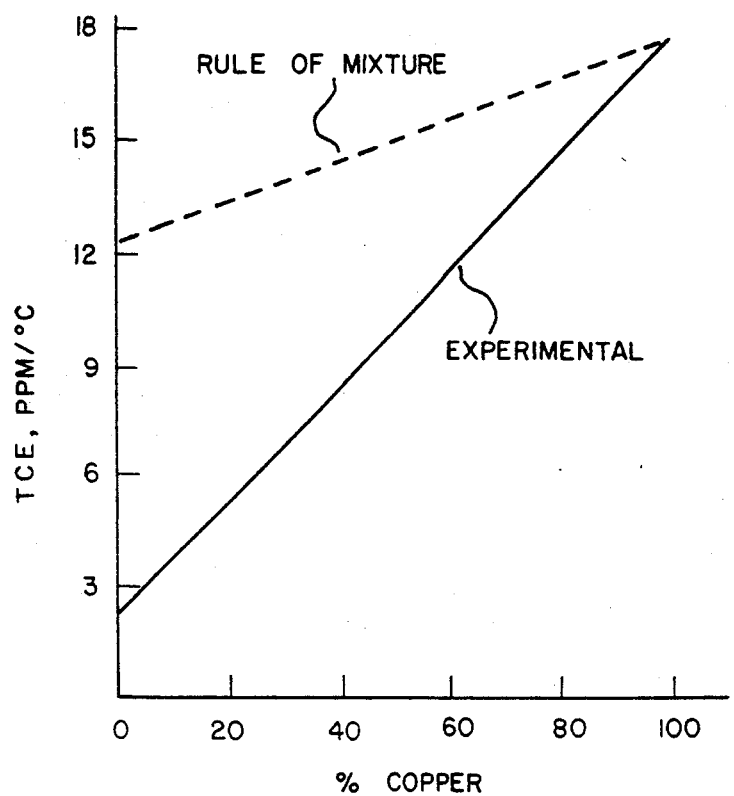
FIG. 1 is a graph illustrating the thermal coefficient of expansion of copper-iron-nickel alloys having an iron to nickel ratio of 1.67:1 as a function of copper content.

It has been suprisingly found that the alloys of the present invention exhibit thermal coefficients of expansion significantly less than those one would expect to see from the Rule of Mixtures of Elements. FIG. 1 compares the thermal coefficients of expansion one would expect to see from the Rule of Mixtures for Cu(-Fe$_5$Ni$_3$) alloys as a function of copper content with actual experimental values. The experimental values were determined by Jelrus casting a number of alloys having the nominal compositions illustrated in Table I, cold rolling the cast alloys about 35%, and annealing the alloys at 1100° C. for 2 hours. A standard test was used to determine the coefficient of thermal expansion. The test comprised heating samples of each alloy and platinum to about 0° C. and comparing the expansion of each alloy sample to that of the platinum sample.

TABLE I

| ALLOY | FE (wt %) | NI (wt %) | CU (wt %) |
|-------|-----------|-----------|-----------|
| A | 10 | 6 | bal. |
| B | 20 | 12 | " |
| C | 30 | 18 | " |
| D | 40 | 24 | " |
| E | 50 | 30 | " |
| F | 60 | 36 | " |

Figure 2:
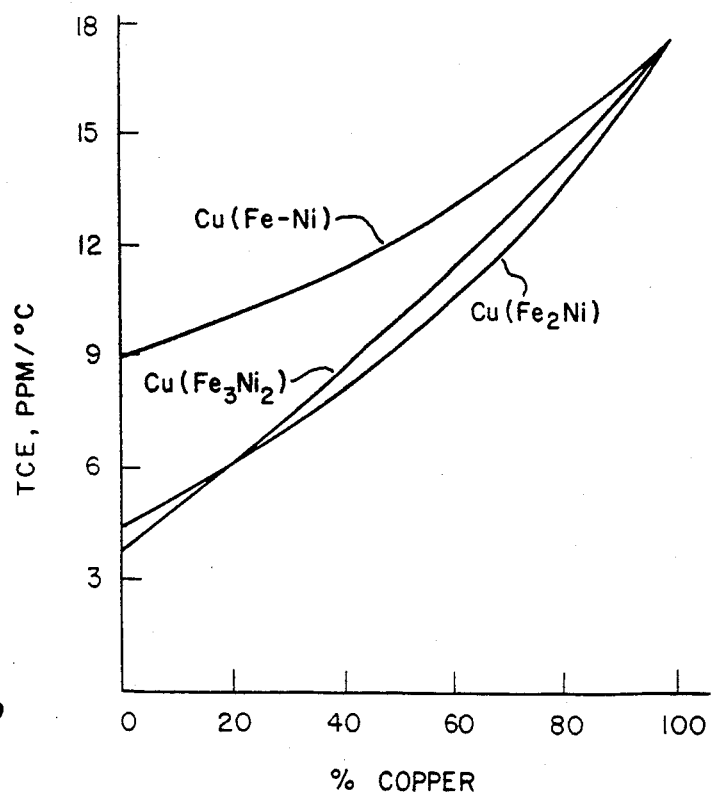
FIG. 2 is a graph illustrating the thermal conductivity of copper-nickel-iron alloys having different iron to nickel ratios as a function of copper content.

As previously mentioned, it has been found that the thermal coefficient of expansion of copper-iron-nickel alloys is a function of the iron to nickel ratio of the alloys. FIG. 2 illustrates the thermal coefficient of expansion as a function of copper content for alloys having iron to nickel ratios of 1:1; 1.5:1; and 2.0:1. This figure clearly shows the relationship between the thermal coefficient of expansion and the iron to nickel ratio. The data for FIG. 2 was obtained by casting and processing as before a number of alloys having the above iron to nickel ratios. The thermal coefficients of expansion of the cast and processed alloys were measured using the aforementioned standard test. The nominal compositions of the cast alloys are given in Table II. It can be seen from FIG. 2 that alloys having iron to nickel ratios in accordance with the present invention have significantly lower thermal coefficients of expansion than alloys having an iron to nickel ratio of 1:1.

TABLE II

| ALLOY | FE (wt %) | NI (wt %) | CU (wt %) |
|-------|-----------|-----------|-----------|
| G | 10 | 10 | bal. |
| H | 20 | 20 | " |
| I | 30 | 30 | " |
| J | 10 | 5 | " |
| K | 30 | 15 | " |
| L | 40 | 20 | " |
| M | 50 | 25 | " |
| N | 60 | 30 | " |
| O | 67 | 33 | — |
| P | 12 | 8 | bal. |
| Q | 24 | 16 | " |
| R | 30 | 24 | " |
| S | 48 | 32 | " |
| T | 60 | 40 | " |

Figure 3:
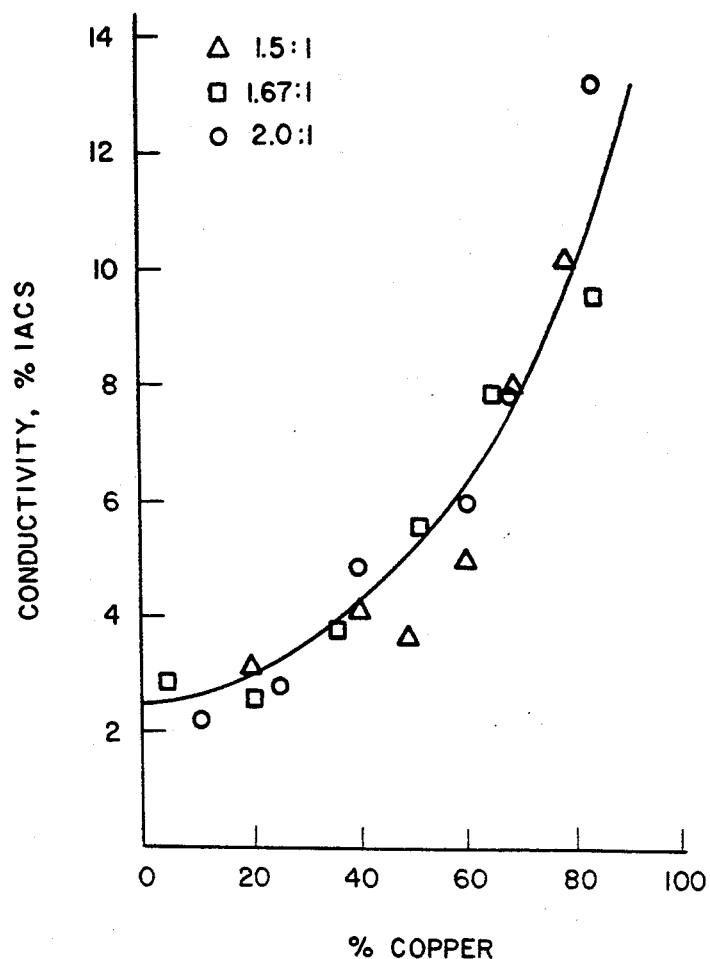
FIG. 3 is a graph illustrating the electrical conductivity of alloys in accordance with the present invention as a function of copper content.

The conductivity properties, in particular the electrical conductivity, of the present alloys are primarily determined by the copper content. The iron to nickel ratio in the alloy does not appear to significantly affect electrical conductivity. FIG. 3 clearly illustrates the relationship between electrical conductivity and copper content for alloys having an iron to nickel ratios of 1.5:1, 1.67:1, and 2.0:1, respectively. As the copper content of the alloy increases, the electrical conductivity increases.

The alloys of the present invention may be cast in any desired manner. For example, the alloys could be continuously or semi-continuosly cast, Durville cast, MHD cast, or Jelrus cast. After casting, the alloys may be processed in any desired manner to produce a desired set of properties. For example, the alloys may be subjected to solutionizing treatments, hot rolling, cold working such as by cold rolling, and one or more heat treatments. For example, after having been worked to a desired gage, the alloy may be annealed at temperatures in the range of from about 1000° C. to about 1200° C. for about 1 to about 48 hours to provide a desired temper. If desired, the alloys of the present invention may be subjected to a series of cold working steps with one or more interanneals to provide a product at a desired gage and a desired temper.

Metallographic examination of the alloys have shown that alloys having a low copper content (less than 20 wt. %) are essentially single phase alloys with an iron-nickel matrix. Alloys containing 20-40 wt. % copper are two-phase alloys with the iron-nickel phase being a continuous phase. Alloys having a copper content greater than 40 wt. % are also two-phase alloys but here the copper phase tends to be the continuous phase. The microstructure of the alloy is believed to have a definite influence on both thermal and electrical conductivity. High copper content alloys, where the continuous phase is the copper phase, not only have high conductivities to start but can have their conductivities improved by heat treatment. Medium copper alloys on the other hand will not significantly change their conductivity through heat treatment. The conductivities of low copper alloys are affected even less by heat treatment.

Tests were conducted to study the effect of low temperature heat treatments on the electrical conductivity of the alloys of the present invention. These tests included preparing a number of alloy samples as before, solution treating the samples, and aging some of the samples at 400° C. for 48 hours. Table III illustrates the nominal compositions of the alloy samples and their electrical conductivities after solution treatment and aging.

TABLE III

| ALLOY COMPOSITION | | | CONDUCTIVITY (% IACS) | |
|---|---|---|---|---|
| Fe | Ni | Cu | Solution Treated | Aged |
| 10 | 5 | bal. | 13.2 | 18.3 |
| 30 | 15 | " | 5.2 | 7.2 |
| 50 | 25 | " | 2.8 | 3.0 |
| 12 | 8 | " | 10.2 | 16.3 |
| 24 | 16 | " | 5.0 | 8.0 |
| 48 | 24 | " | 3.1 | 2.9 |

It can be seen from Table III that the electrical conductivity of high copper content alloys (greater than 50% copper) was improved significantly by low temperature heat treatment while that of low copper content alloys was not significantly affected. From observations made during these tests, it is believed that the alloys of the present invention are thermally stable and that the thermal coefficient of expansion would only vary by about less than plus or minus 10% after low temperature heat treatment.

It is further believed that the conductivity of low copper alloys with low thermal coefficients of expansion can be improved if the surface volume of the iron-nickel phase is minimized, for example by spheroidizing the iron-nickel phase. Various techniques could be employed to do this. For example, magnetohydrodynamic stir casting such as that shown in U.S. Pat. Nos. 4,457,355 to Winter et al., 4,465,118 to Dantzig et al., and 4,482,012 to Young et al., which are all hereby incorporated by reference herein, could be used to spheroidize the high melting iron-nickel phase during solidification. Using this approach, the copper phase which is the low melting constituent of the alloy would be the continuous phase. A powder metal route may also be used to produce the desired microstructure.

The alloys of the present invention have a number of uses in the electronics industry. For example, the alloys can be used in metal semiconductor packaging as a buffer material between the chip material and the metal packaging material. The thermal coefficient of expansion for a typical chip material is in the range of 3 to 5.5 ppm/°C. The thermal coefficient of expansion for typical metal packaging materials is about 16 ppm/°C. If the chip were bonded directly to the metal packaging material, the mismatch of the thermal coefficients could cause the chip to break. To prevent this, a buffer layer is used intermediate the chip and the package. To prevent breakage of the chip, the thermal coefficient of expansion of the buffer material should be similar to that of the chip. Copper-iron-nickel alloys in accordance with the present invention having a copper content in the range of from about 20 wt. % to about 80 wt. % are useful for this application because they have a coefficient of thermal expansion in the range of from about 4 ppm/°C. to about 12 ppm/°C. In addition, they have an electrical conductivity in the range of from about 3% IACS to about 15% IACS. An alloy which could be used for this application is one consisting essentially of from about 20% to about 80% copper, from about 12% to about 52% iron and the balance nickel with the iron to nickel ratio being in the range of from about 1.5:1 to 2.0:1.

The alloys of the present invention may also be used in printed circuit boards for leadless chip carriers. Currently copper clad Invar is the material of choice for this application. Copper clad Invar is a troublesome material because it has undesirable expansion properties along the Z-axis. In addition, non-uniform heating can cause copper clad Invar to distort. Alloys in accordance with the present invention having a copper content in the range of from about 30 wt. % to about 45 wt. % should be useful for this application. This is because these alloys have substantially the same expansion properties along the X-, Y- and Z-axes. In addition, the material is homogeneous. As a result, non-uniform heating will not distort its shape. Still further, such an alloy will have a thermal coefficient of expansion in the range of from about 6 ppm/°C. to about 8 ppm/°C. which is a good match with the thermal coefficient of expansion of typical carrier materials such as $Al_2O_3$. The thermal coefficient of expansion of $Al_2O_3$ is about 6.4 ppm/°C. An alloy which can be used for this application consists essentially of from about 30% to about 45% copper, from about 33% to about 46% iron and the balance nickel with the iron to nickel ratio being in the range of from about 1.5:1 to about 2.0:1.

The alloys of the present invention also may be used as a substrate for very large silicon chips. Currently, $Al_2O_3$ is typically used as a packaging material or substrate for small semiconductor chips. However, the mismatch between its thermal coefficient of expansion and that of large chips renders it unsuitable for this type of application. Alloys in accordance with the present invention having a copper content in the range of from about 10 wt. % to about 25 wt. % will be useful as a substrate for very large silicon chips because of the good match between the thermal coefficients of expansion. An alloy particularly suitable for this application is one consisting essentially of from about 10% to about 25% copper, from about 45% to about 9% iron and the balance nickel with the iron to nickel ratio being in the range of from about 1.5:1 to about 2.0:1.

As used herein, the percentage of each alloy constituent is a weight percentage (wt. %).

The patents and article set forth in the specification are intended to be incorporated by reference herein.

It is apparent that there has been provided in accordance with this invention a copper-iron-nickel composite material for electrical and electronic applications which fully satisfies the objects, means, and advantages set forth hereinbefore. While the invention has been described in combination with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

What is claimed is:

1. A composite material for use in electrical and electronic applications comprising a first phase consisting essentially of a continuous copper matrix and a second discontinuous phase consisting essentially of an iron nickel alloy with the ratio of said iron to said nickel being in the range of from about 1.5:1 to about 2.0:1, said material consisting essentially of from about 20% to about 80% copper, from about 12% to about 59% iron and the balance nickel.

2. The composite material of claim 1 further comprising:

said iron to nickel ratio being in the range of from about 1.6:1 to about 1.9:1.

3. The composite material of claim 1 further consisting essentially of from about 20% to about 80% copper, from about 12% to about 52% iron and the balance nickel.

4. The composite material of claim 1 further consisting essentially of from about 30% to about 45% copper, from about 33% to about 46% iron and the balance nickel.

5. The composite material of claim 4 further comprising said second discontinuous phase consisting essentially of discrete spherical particles uniformly dispersed throughout said continuous copper matrix.

6. The composite material of claim 1 further consisting essentially of from about 20% to about 25% copper, from about 45% to about 59% iron and the balance nickel.

7. A substrate for supporting silicon chips comprising said substrate being formed from a composite material comprising a first phase consisting essentially of a continuous copper matrix and a second discontinuous phase consisting essentially of an iron nickel alloy with the iron to nickel ratio being in the range of from about 1.5:1 to about 2.0:1, said material consisting essentially of from about 20% to about 80% copper, from about 12% to about 59% iron and the balance nickel.

8. The substrate of claim 7 further comprising said second discontinuous phase consisting essentially of spherical particles to minimize the surface area of said second phase.

* * * * *